United States Patent
Ashida et al.

(10) Patent No.: US 7,010,434 B2
(45) Date of Patent: Mar. 7, 2006

(54) COMPLEMENTARY DIVISION CONDITION DETERMINING METHOD AND PROGRAM AND COMPLEMENTARY DIVISION METHOD

(75) Inventors: Isao Ashida, Kanagawa (JP); Kohichi Nakayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 74 days.

(21) Appl. No.: 10/819,969

(22) Filed: Apr. 8, 2004

(65) Prior Publication Data
US 2004/0210423 A1  Oct. 21, 2004

(30) Foreign Application Priority Data
Apr. 16, 2003 (JP) .................... P2003-112045

(51) Int. Cl.
*G01B 3/00* (2006.01)
*G01B 5/00* (2006.01)
(52) U.S. Cl. ............................................. 702/33
(58) Field of Classification Search ............ 702/33, 702/41–44, 86, 97, 155, 158, 166; 703/5–7; 716/19–21; 438/14, 15
See application file for complete search history.

(56) References Cited

U.S. PATENT DOCUMENTS
6,780,659 B1 * 8/2004 Ashida .................. 438/16

FOREIGN PATENT DOCUMENTS
| JP | 2002-260983 | 9/2002 |
| JP | 2002-260992 | 9/2002 |
| JP | 2003-353102 | 12/2002 |
| JP | 2003-031471 | 1/2003 |
| JP | 2003-045786 | 2/2003 |

* cited by examiner

*Primary Examiner*—Michael Nghiem
(74) *Attorney, Agent, or Firm*—Radar Fishman & Grauer

(57) ABSTRACT

A complementary division condition determining method and program and a complementary division method able to propose the optimum complementary division conditions for suppressing pattern displacement and mask destruction, wherein an internal stress of a mask is determined based on a displacement of a peripheral mark in a case when forming an opening in the mask and this value is used for first analysis (step ST12), pattern displacement and stress concentration occurring due to openings of split patterns are analyzed based on a first analysis model in a first analysis (step ST13), and a displacement due to external force of the membrane between the split patterns is analyzed in a second analysis (step ST14).

10 Claims, 13 Drawing Sheets

COMPLEMENTARY DIVISION CONDITION DETERMINING METHOD AND PROGRAM AND COMPLEMENTARY DIVISION METHOD

BACKGROUND OF THE INVENTION

1. Field of the Invention

The present invention relates to a method of determining conditions for complementary division of a pattern comprised by an opening formed in a stencil mask used in, for example, a lithography step of a semiconductor device and a complementary division method and a program using the same.

2. Description of the Related Art

X-ray, ion, and electron beam lithography use stencil masks. Patterns are formed in a stencil mask by openings, so donut-shaped and other hard-to-form patterns are formed by complementary division (see Japanese Patent No. 3348097, Japanese Unexamined Patent Publication (Kokai) No. 2003-45786, Japanese Unexamined Patent Publication (Kokai) No. 2002-353102, Japanese Unexamined Patent Publication (Kokai) No. 2002-260983, and Japanese Unexamined Patent Publication (Kokai) No. 2002-260992).

Stencil masks suffer from two problems. One is that an internal stress changes by the formation of an opening of a pattern in the membrane (thin film) and therefore the positions of the surrounding patterns change. Another is that there is a possibility of mask destruction due to the concentration of stress occurring due to the opening shape. The occurrence of this problem can be reduced by complementary division.

In the conventional complementary division method, however, the complementary division has been mainly performed for hard-to-form pattterns, for example, donut patterns and leaf patterns. The optimum complementary division conditions have not been proposed for other patterns such as line patterns, line-and-space patterns (LS patterns), and large area patterns which become factors causing pattern displacement and mask destruction due to stress concentration.

SUMMARY OF THE INVENTION

An object of the present invention is to provide a complementary division condition determining method and program able to propose the optimum complementary division conditions for suppression of pattern displacement and mask destruction.

Another object of the present invention is to provide a complementary division method for performing complementary division processing by using the above optimum complementary division conditions.

To attain the first object, according to a first aspect of the present invention, there is provided a complementary division condition determining method comprising a step of measuring a displacement of a peripheral mark when forming an opening in a mask and determining an internal stress of said mask based on said measured displacement; a first analysis step of setting a first analysis model forming split patterns obtained by dividing a pattern for division under various division conditions at said mask having said internal stress and analyzing pattern displacement and stress concentration occurring due to the openings of said split patterns based on said first analysis model; a second analysis step of setting a second analysis model assuming a membrane between said split patterns as a two-ended fixed structure and analyzing the displacement of the membrane between said split patterns due to the external force based on said second analysis model; and a step of determining complementary division conditions based on the results of said first and second analysis steps and an allowable displacement and stress concentration.

To attain the first object, according to a second aspect of the present invention, there is provided a program for making a computer execute processing for determining division conditions for dividing pattern data, comprising a routine for determining an internal stress of a mask based on a displacement of a peripheral mark when forming an opening in the mask; a first analysis routine for setting a first analysis model forming split patterns obtained by dividing a pattern for division under various division conditions at said mask having said internal stress and analyzing pattern displacement and stress concentration occurring due to the openings of said split patterns based on said first analysis model; a second analysis routine for setting a second analysis model assuming a membrane between said split patterns as a two-ended fixed structure and analyzing the displacement of the membrane between said split patterns due to the external force based on said second analysis model; and a routine for determining the complementary division conditions based on the results in said first and second analysis routines and an allowable displacement and stress concentration.

To attain the second object, according to a third aspect of the present invention, there is provided a complementary division method for dividing a pattern defining an opening formed in a mask, comprising a step of measuring a displacement of a peripheral mark when forming an opening in said mask and determining an internal stress of said mask based on the measured displacement; a first analysis step of setting a first analysis model forming split patterns obtained by dividing a pattern for division under various division conditions at said mask having said internal stress and analyzing pattern displacement and stress concentration occurring due to the openings of said split patterns based on said first analysis model; a second analysis step of setting a second analysis model assuming a membrane between said split patterns as a two-ended fixed structure and analyzing the displacement of the membrane between said split patterns due to external force based on said second analysis model; a step of determining the complementary division conditions based on the results of said first and second analysis steps and an allowable displacement and stress concentration; and a step of extracting said pattern for division from the pattern data of said mask and dividing said pattern for division based on said determined complementary division conditions.

The complementary division condition determining method and program of the present invention determine the internal stress of the mask based on the displacement of a peripheral mark when forming an opening in the mask and use this value for the first analysis.

In the first analysis, the pattern displacement and stress concentration occurring due to the openings of the split patterns are analyzed based on the first analysis model.

In the second analysis, the displacement of the membrane between the split patterns due to external force is analyzed. The order of the first and second analyses is not important.

In this way, both of the results of the first analysis performed from the viewpoint of the influence of openings of patterns and the second analysis performed from the viewpoint of the strength of the membrane between the patterns are used, the complementary division conditions are determined based on the allowable displacement and stress concentration.

The complementary division method of the present invention divides the pattern for division based on the complementary division conditions determined as described above.

BRIEF DESCRIPTION OF THE DRAWINGS

These and other objects and features of the present invention will become clearer from the following description of preferred embodiments given with reference to the accompanying drawings, in which:

FIGS. 13A and 13B are views of results obtained by analysis using the first analysis model for determining the division conditions of the large area pattern, wherein FIG. 13A shows the result of analysis of pattern displacement; and FIG. 13B shows the result of analysis of Mises stress;

DESCRIPTION OF THE PREFERRED EMBODIMENTS

Below, preferred embodiments of a complementary division condition determining method and program and a complementary division method of the present invention will be described with reference to the accompanying drawings.

Figure 1A:
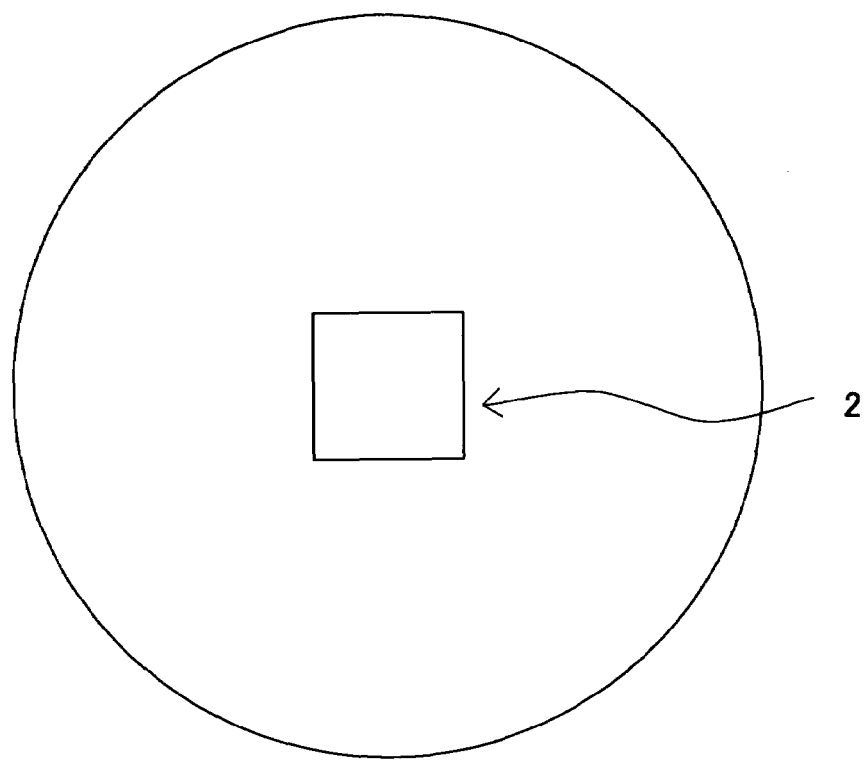
FIG. 1A is a plan view of a stencil mask prepared when the complementary division method according to the present invention is applied.
Figure 1B:
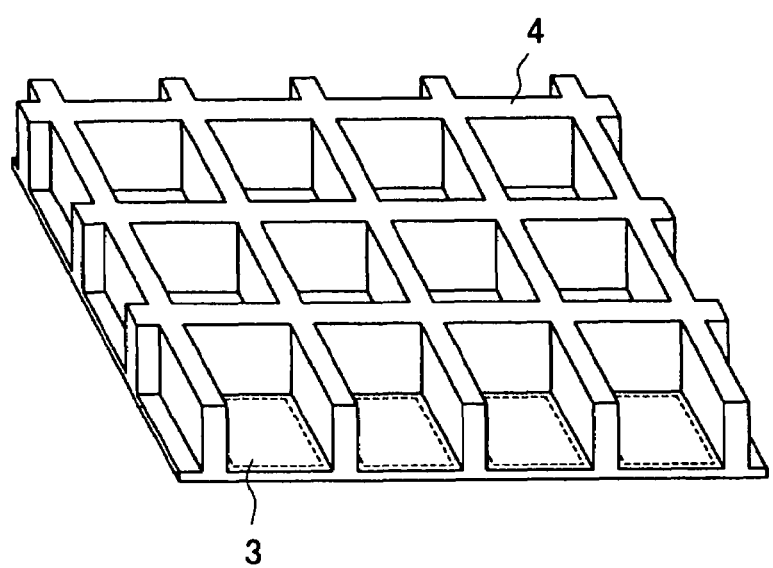
FIG. 1B is a detailed perspective view of an exposure area of FIG. 1A.

FIG. 1A is a plan view of a stencil mask prepared when applying the complementary division method according to the present invention, and FIG. 1B is a detailed perspective view in an exposure area of FIG. 1A.

As shown in FIG. 1A, in a stencil mask, for example, an exposure area 2 to which X-rays, ions, or electron beams are emitted is arranged at the center of, for example, a disk-shaped member. As shown in FIG. 1B, a plurality of thin films (hereinafter referred to as "membranes") 3 having thicknesses of about 100 nm to 10 $\mu$m are formed in the exposure area 2. Not illustrated opening patterns are formed in the membranes 3. In the exposure area 2, struts 4 are formed for reinforcing the thin membranes 3. The above stencil mask is prepared based on, for example, an SOI wafer. The thickness of the struts 4 is the same as that of, for example, an 8-inch diameter silicon substrate, that is, about 725 $\mu$m.

Figure 2:
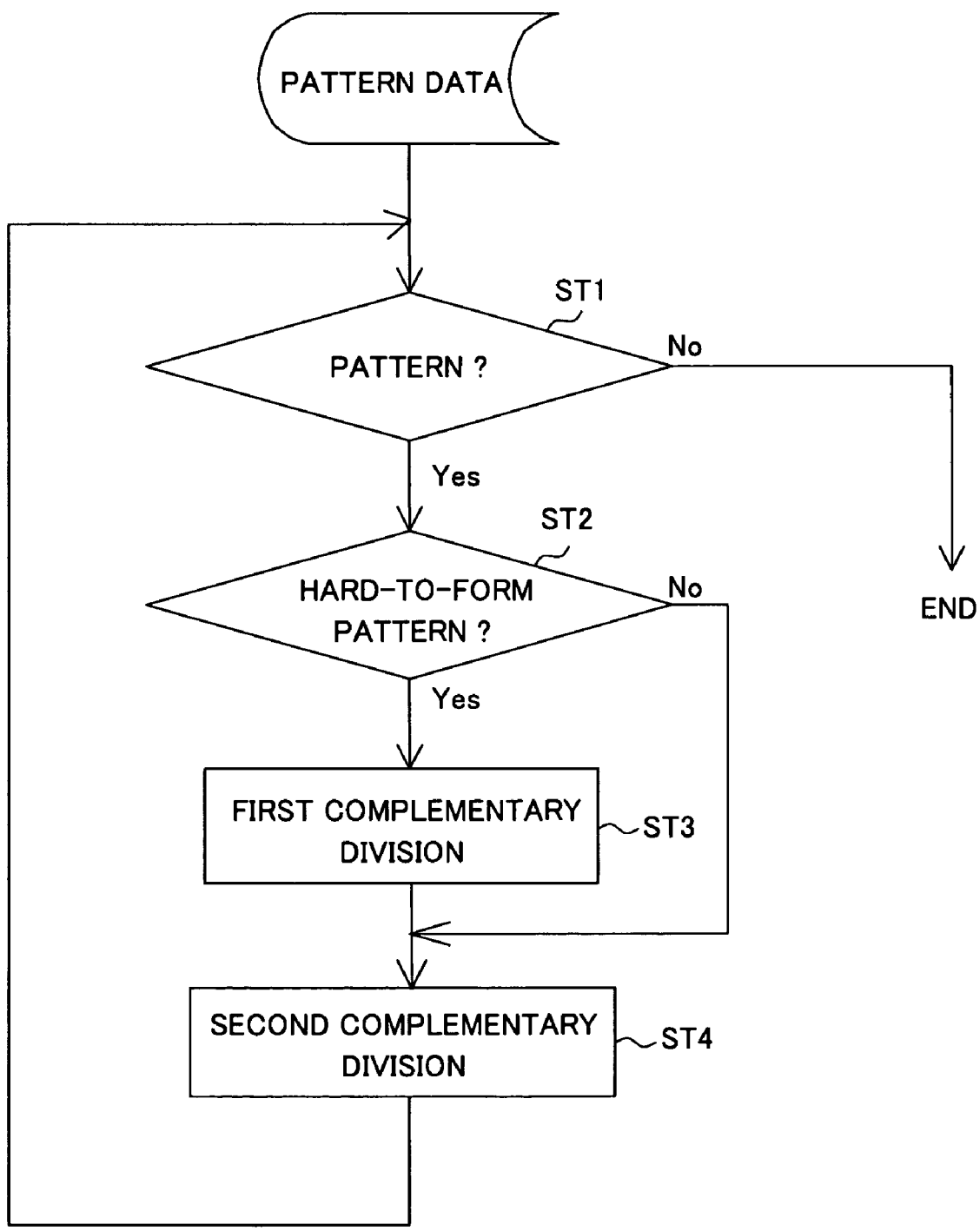
FIG. 2 is a flow chart of the complementary division method according to the present invention.

FIG. 2 is a flow chart of complementary division for arranging patterns comprised by openings in the above stencil mask.

As shown in FIG. 2, in the complementary division, a pattern is extracted from the pattern data (design data) (step ST1) and judged whether or not the extracted pattern is a hard-to-form pattern such as a donut pattern or a leaf pattern (step ST2). A hard-to-form pattern is always complementary divided by the first complementary division processing (step ST3).

FIGS. 3A to 3F are views for explaining the first complementary division processing. In FIGS. 3A to 3F, the explanation is given with reference to the examples of a donut pattern and leaf pattern which become problems when preparing a stencil mask.

Figure 3:
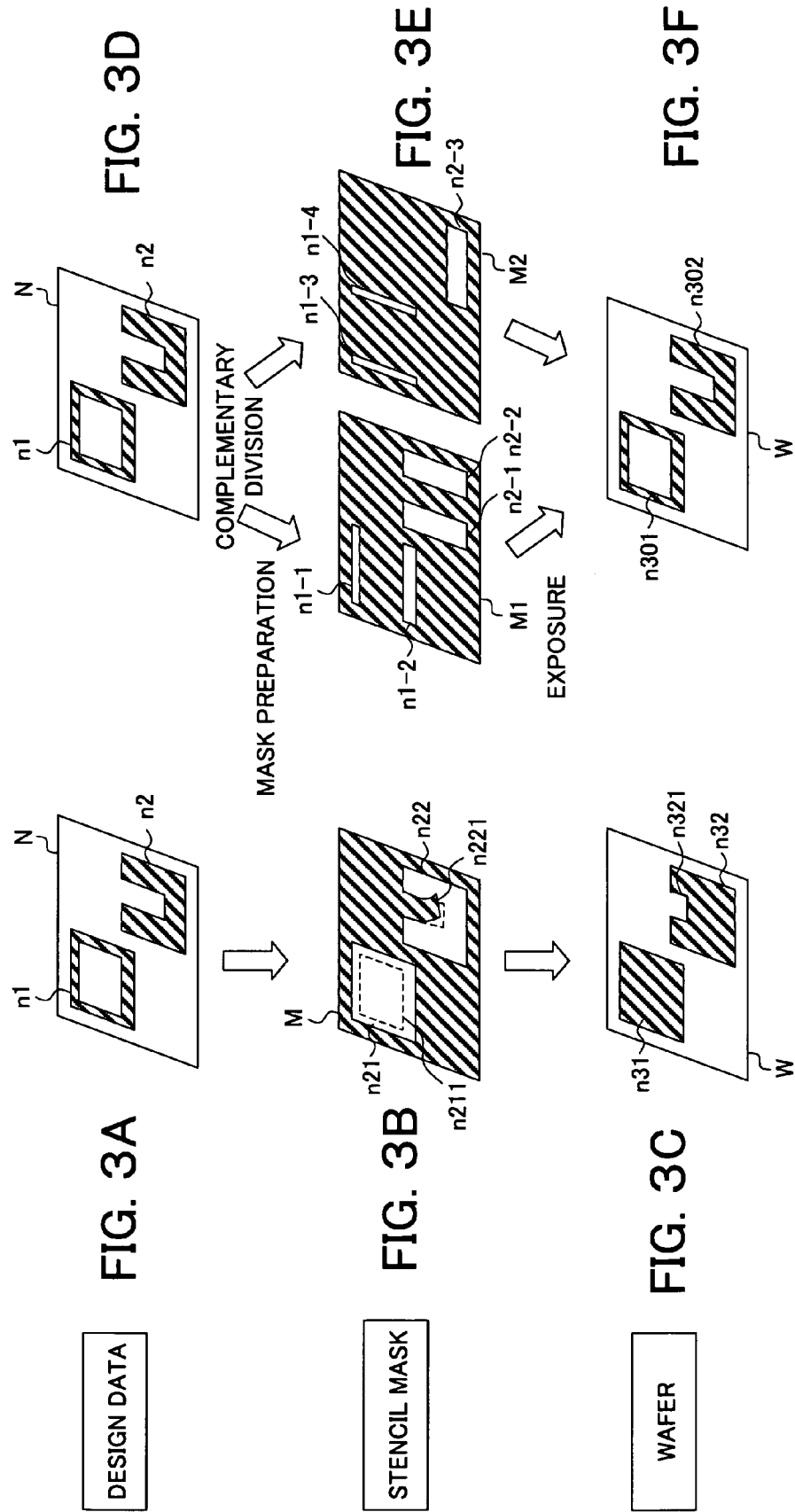
FIGS. 3A to 3F are views for explaining first complementary division processing in the complementary division method in the present invention.

For example, where a donut pattern n1 and a leaf pattern n2 are included in pattern data N as shown in FIG. 3A, it is impossible to form the donut pattern n1 as it is in a stencil mask M. Namely, as shown in FIG. 3B, a pattern n211 at the center portion cannot be supported and therefore the shape n21 results. When using the stencil mask M for exposure, a pattern n31 missing the center portion is formed in a wafer W as shown in FIG. 3C.

Further, when forming the leaf pattern n2 as shown in FIG. 3A as it is in a thin stencil mask M, as shown in FIG. 3B, the portion supporting the center projecting portion n221 is small, so it droops due to gravity. Stress may concentrate at the support point thereof to cause a destruction. When using this stencil mask M for exposure, for example, as shown in FIG. 3C, a pattern n32 having a shape with a deformed center portion n321 is formed.

Accordingly, in the first complementary division processing, as shown in FIG. 3D, when the pattern data N includes, for example, the donut pattern n1, as shown in FIG. 3E, the donut pattern n1 is divided into split patterns n1-1 to n1-4. After the division, the split patterns n1-1 and n1-2 are arranged in a first area M1 of the mask, while the split patterns n1-3 and n1-4 are arranged in a second area M2 of the mask. By exposing the areas M1 and M2 of the mask overlappingly, a donut pattern n301 will be formed at the wafer W as shown in FIG. 3F.

Further, in the first complementary division processing, as shown in FIG. 3D, when for example the pattern data N includes the leaf pattern n2, as shown in FIG. 3E, the leaf pattern n2 is divided into split patterns n2-1 to n2-3. After the division, the split patterns n2-1 and n2-2 are arranged in the first area M1 of the mask, and the split pattern n2-3 is arranged in the second area M2 of the mask. Then, by exposing the areas M1 and M2 of the mask overlappingly, a leaf pattern n302 will be formed in the wafer W as shown in FIG. 3F.

Returning to the flow chart of FIG. 2 again, it is decided whether or not a pattern not processed by the first complementary division processing or a pattern to which the first complementary division processing was applied is a pattern causing position offset of the other patterns or the mask destruction in the stencil mask. If necessary, it is divided by the second complementary division processing (step ST4).

After performing the above processing for all patterns included in the pattern data, the complementary division processing is terminated. The complementarily split patterns are formed allocated to the different areas of the mask as explained with reference to FIG. 3E.

The present invention relates to the second complementary division processing in the flow of the complementary division and provides a complementary division condition determining method for determining the complementary division conditions of a pattern for complementary division in the second complementary division processing and a program for executing this and a complementary division method for performing the complementary division using the determined complementary division conditions.

Figure 4:
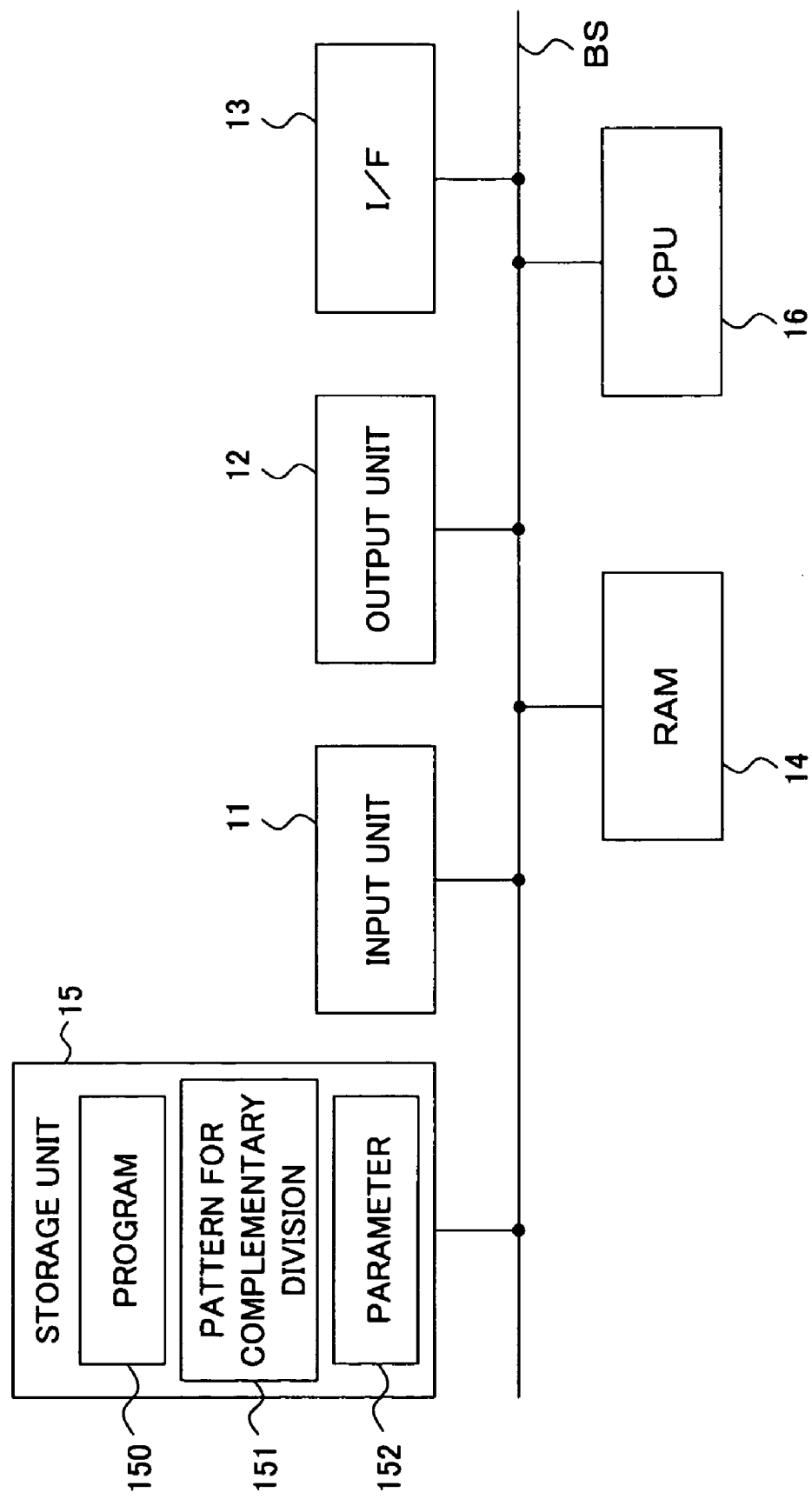
FIG. 4 is a block diagram of hardware of a data processing system (computer) for determining the complementary division conditions by running a program according to the present invention.

FIG. 4 is a block diagram of the hardware of a data processing system (computer) for determining complementary division conditions by running the program according to the present invention.

The data processing device has, as shown in FIG. 4, an input unit 11, an output unit 12, an interface (I/F) 13, a RAM 14, a storage unit 15, and a central processing unit (CPU) 16. The input unit 11, the output unit 12, the I/F 13, the RAM 14, the storage unit 15, and the CPU 16 are connected by a bus BS.

The input unit 11 outputs intended input data to the CPU 16. The input unit 11 is a data input device such as a keyboard or mouse, CDROM (R-RW) drive, or floppy disk drive (FD). The input unit 11 can be used for input of, for example, a pattern for complementary division 151 and parameters 152 as the input data.

The output unit 12 outputs data in accordance with the predetermined output data output from the CPU 16. The output unit 12 is a display etc. and performs a display in accordance with the output data output from the CPU 16.

The interface (I/F) 13 transfers the intended data with another data processing system under the control of the CPU 16.

The RAM 14 is used as a workspace when the CPU 16 performs the predetermined processing. The storage unit 15 is used for writing and reading the intended data by the CPU 16.

The storage unit 15 stores the pattern for complementary division 151, various parameters 152, etc. in addition to a program 150 according to the present invention.

The program 150 includes processing routines concerning the complementary division condition determining processing according to the present invention and executed by the CPU 16 using the RAM 14 as a workspace.

The pattern for complementary division 151 is a pattern for the second complementary division processing as will be explained later.

The parameters 152 include data of characteristics of the stencil mask (material etc. of the mask) used for the stress-strain analysis, values of the allowable displacement and stress concentration, and numerical values used for judgment in various analyses.

Figure 5:
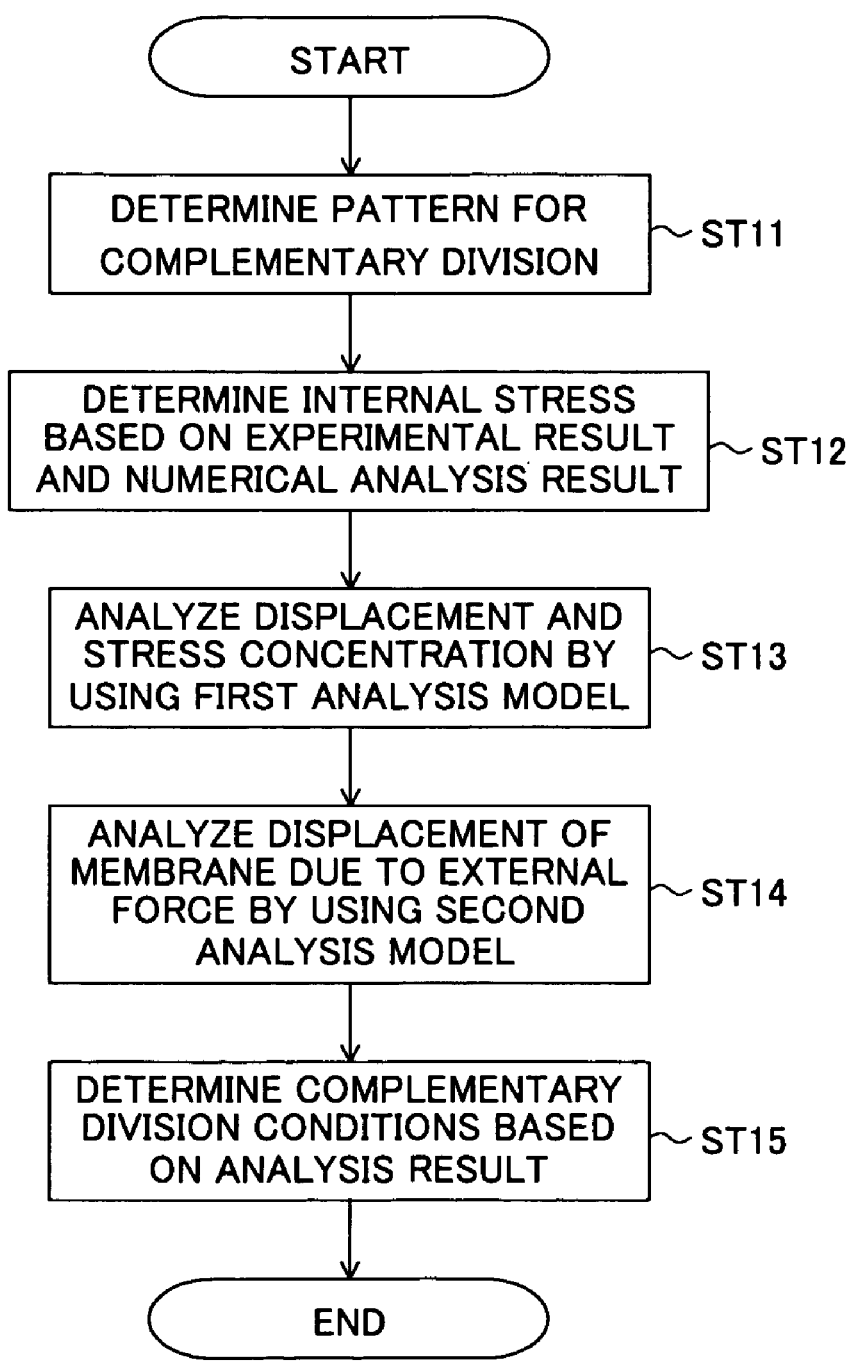
FIG. 5 is a flow chart of the complementary division condition determining method according to the present invention.

FIG. 5 is a flow chart of the complementary division condition determining method executed by the above program.

As shown in FIG. 5, in the present invention, first, a pattern for the second complementary division processing is determined (step ST11). The processing from step ST12 to step ST15 is performed for the pattern for complementary division to determine the division conditions for the pattern.

FIGS. 6A to 6D show examples of patterns for second complementary division processing. As explained by using FIG. 2, hard-to-form shapes such as donut patterns and leaf patterns are dealt with by the first complementary division processing. Accordingly, the second complementary division processing deals with mainly close to rectangular patterns which are not hard to form, but which may cause position offset of other patterns or mask destruction in the stencil mask.

Figure 6A:
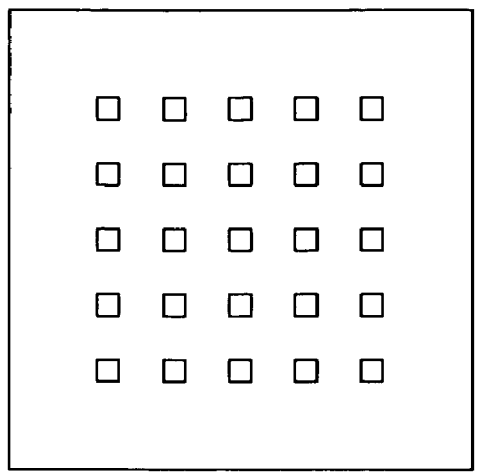
FIGS. 6A to 6D are views of examples of patterns which becomes targets of second complementary division processing.
Figure 6B:
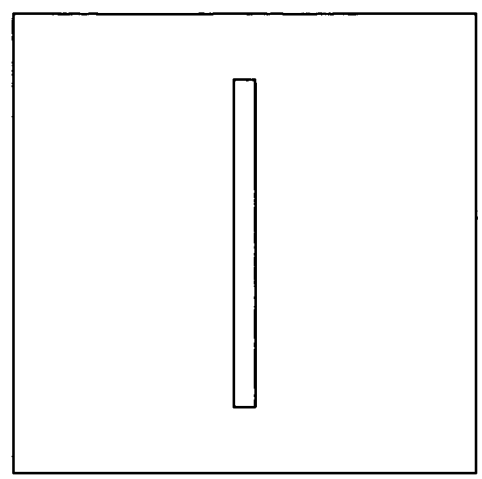
Figure 6C:
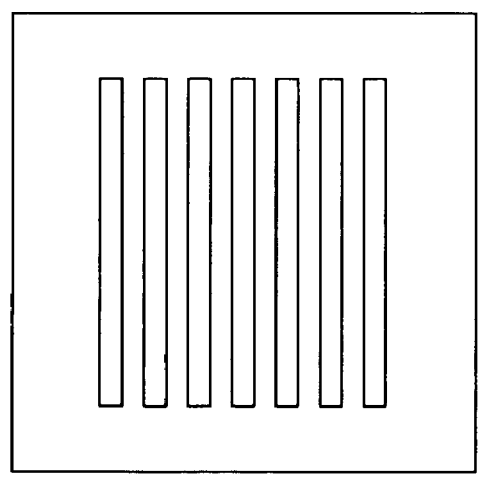
Figure 6D:
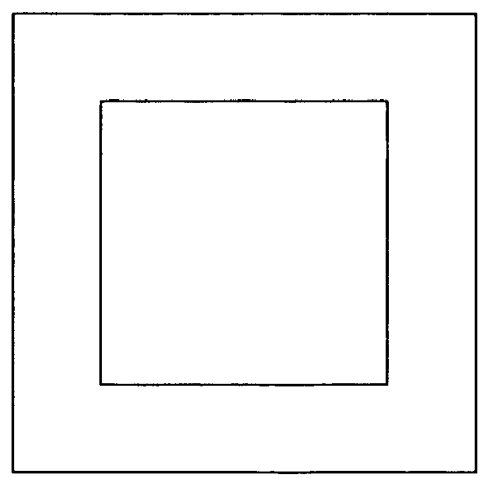

The patterns shown in FIG. 6A are contact hole patterns for contact to the device. The pattern shown in FIG. 6B is a line pattern (including also a general rectangle) long in one direction and without any patterns at its periphery. The patterns shown in FIG. 6C are line-and-space patterns (LS patterns) comprised of a plurality of line patterns arranged side by side at predetermined intervals. The pattern shown in FIG. 6D is a large area pattern as will be defined later.

The optimum complementary division conditions for these individual patterns for division are determined by the flow shown in FIG. 5. The determined complementary division conditions are used in the second complementary division processing shown in FIG. 2 (step ST4). Due to the optimal division of these patterns in the second complementary division processing, the offset or the stress concentration at each opening is reduced to the lowest limit and thereby the entire offset or stress concentration can be minimized.

In the present invention, the division conditions of a pattern for complementary division are determned by stress-strain analysis by the finite element method etc., but it is first necessary to determine the conditions used for this stress-strain analysis (step ST12).

Among the conditions required for stress-strain analysis by the finite element method, for example, the physical properties of the material of the stencil mask are made, for example, a Young's modulus of 63.9 MPa and a Poisson ratio of 0.2 as disclosed in *Jpn. J. Appl. Phys.*, vol. 38 (1999) pp. 7027–7030. However, the internal stress value of a stencil mask is unknown. Namely, this is because even if the physical properties of the material of stencil masks used are the same, the internal stresses remaining after the fabrication of the stencil masks will differ due to the difference of the process, dimensions, etc. Accordingly, in the present invention, the results of experiments and the results of numerical analysis are calilbrated so as to determine the internal stress of a stencil mask to be prepared (step ST12).

Figure 7:
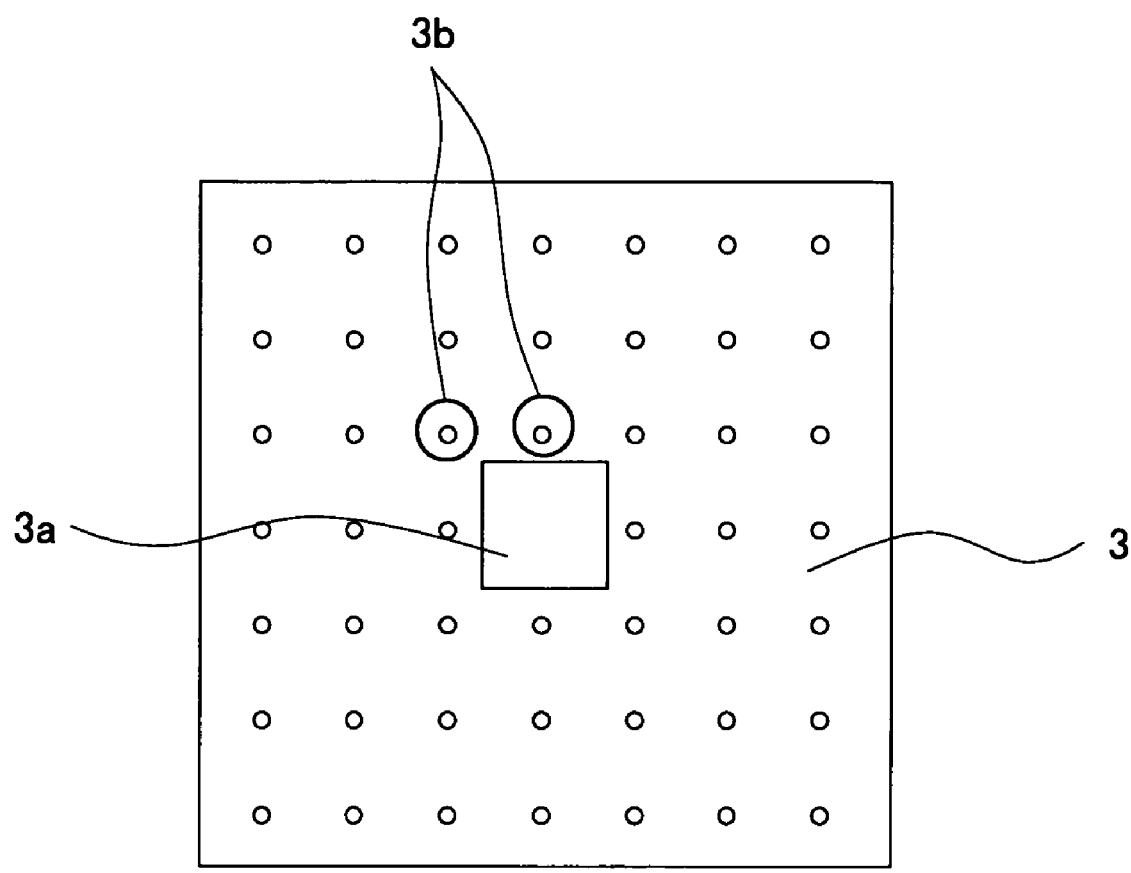
FIG. 7 is an enlarged view of the pattern of a calibration mask.

FIG. 7 is an enlarged view of a pattern of a calibration use mask.

As shown in FIG. 7, the displacement of position offset measurement marks 3b arranged at the periphery of an opening 3a of 100 μm square when forming the opening 3a in for example a membrane 3 of 1 mm square surrounded by not illustrated struts is found by experiment and numerical analysis. Note that the position offset measurement marks 3b are not openings. In the present experiment, use is made of mask blanks of the actually prepared stencil mask.

Figure 8A:
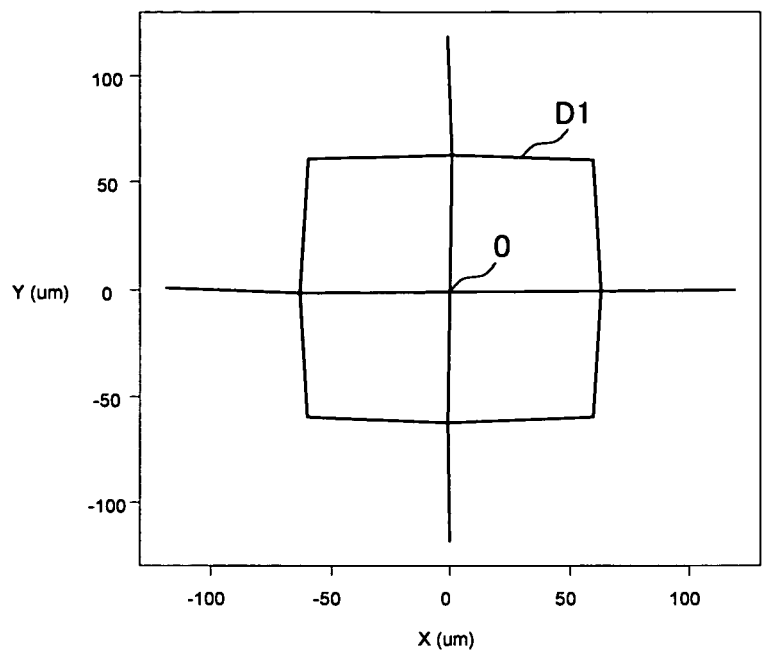
FIG. 8A is a view of measurement results of displacement when forming a stencil mask having the pattern shown in FIG. 7.

FIG. 8A shows measurement results of the displacement of position offset measurement marks 3b when actually fabricating a stencil mask having the pattern shown in FIG. 7.

Specifically, FIG. 8A shows the result of measurement of the displacement of the position offset measurement marks 3b at eight points located nearest the periphery of the opening 3a and the position offset measurement marks 3b at four points located outside the opening 3a in a horizontal direction. FIG. 8A shows a position D1 of the position offset measurement marks 3b from the center O of the opening 3a. The displacement of the position offset measurement marks 3b at the periphery was 22 nm from the experimental result shown in FIG. 8A.

Figure 8B:
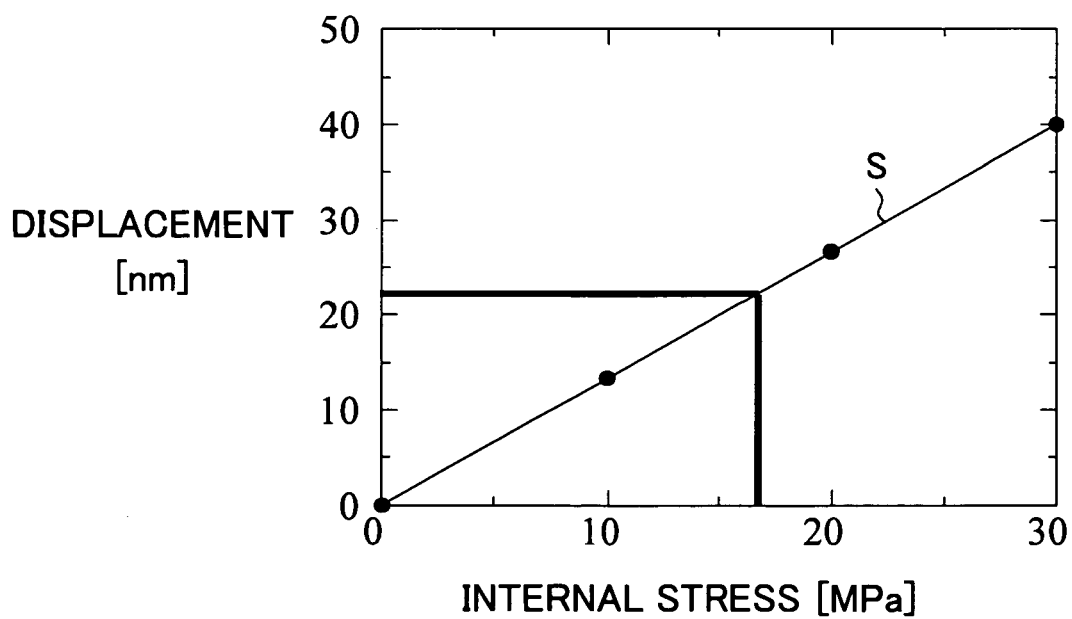
FIG. 8B is a view of the relationship between an internal stress and displacement when forming openings of patterns the same as the experiment.

FIG. 8B is a view of a relationship between the internal stress remaining in the stencil mask and the pattern displacement calculated by numerical analysis (simulation) from the values of the physical properties of the material etc. of the stencil mask when forming an opening having the same pattern as that in the experiment. As shown by the line S in the figure, the position offset of a peripheral mark when forming an opening increases in proportion to the internal stress remaining in the stencil mask. By comparing the analysis result shown in FIG. 8B and the experimental result shown in FIG. 8A, the internal stress of the stencil mask is found. In the present example, in the previous experimental result, the displacement was 22 nm, therefore, as shown in FIG. 8B, the internal stress existing in the stencil mask becomes 17 MPa.

After determining the internal stress of the stencil mask as described above (step ST12), the displacement and stress concentration occurring due to the pattern comprised by the opening are analyzed by using the first analysis model (step ST13). As the conditions of the analysis at this time, other than the previously determined internal stress, use is made of the Young's modulus and the Poisson ratio. Further, the displacement of the membrane between the patterns due to external force received is analyzed by using the second analysis model (step ST14). Below, a detailed explanation will be given of the processing of steps ST13 and ST14.

Figure 9:
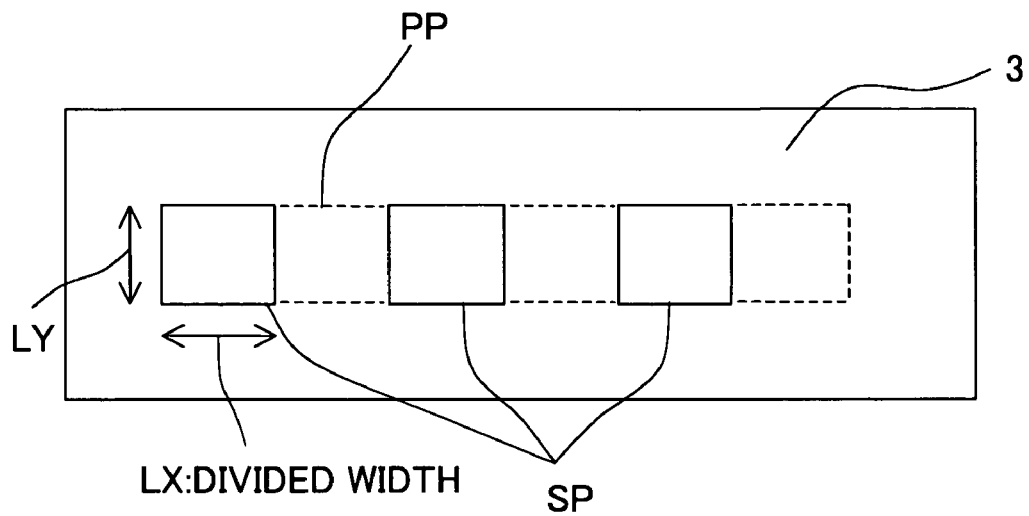
FIG. 9 is a view of a first analysis model for analyzing position offset and stress concentration occurring due to opening patterns obtained after complementary division being formed in a membrane.

FIG. 9 is a view of the first analysis model for analyzing the position offset and stress concentration occurring due to opening patterns obtained after complementary division formed in a membrane.

The first analysis model assumes a case of formation of split patterns obtained by dividing a pattern for complementary division under various division conditions in a stencil mask having internal stress found previously. FIG. 9 shows a first model in which split patterns SP comprised by openings obtained by complementary division of, for example, a line-shaped pre-division pattern PP are formed in the membrane 3. Usually, a rectangular shaped pattern for division is divided along its long side; therefore, in the figure, LY is mainly a short side of the rectangular shaped pattern for division, and LX is a divided width.

Figure 10:
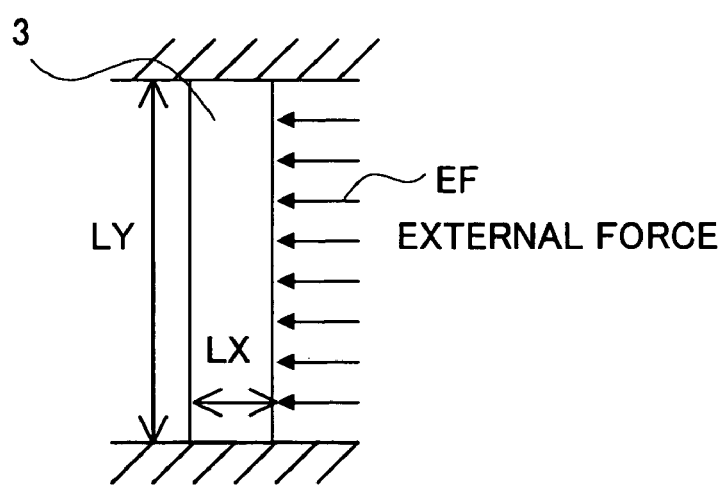
FIG. 10 is a view of a second analysis model for analyzing the displacement of a membrane between split patterns due to external force.

FIG. 10 is a view of a second analysis model for analyzing displacement of the membrane between the split patterns due to external force.

The second analysis model is a model taking note of the fact that the membrane 3 between the split patterns comprised by the openings has a two-ended fixed structure (refer to FIG. 9). Namely, the second analysis model is a model taking note of the fact that two ends of the membrane having the width LX and the length LY are fixed. By using the second analysis model to give the external force considered to be applied during the fabrication of the stencil mask and analyze the displacement, the weakness of the membrane can be investigated. For example, as the external force used in the second analysis model, use is made of surface tension generated at the time of the wet washing used for the fabrication of the stencil mask. For example, when applying the formula used in *Appl. Phys. Lett.*, vol. 66, pp. 2655 (1995), the external force becomes 1.45 MPa. Therefore, this value is used in the present example.

After the first analysis (step ST13 of FIG. 5) using the first analysis model and the second analysis (step ST14 of FIG. 5) using the second analysis model, the complementary division conditions are determined from these two analysis results and the allowable offset and stress concentration (step ST15). The values of the allowable offset and stress concentration are input and stored as parameters 152 in advance (refer to FIG. 4).

Next, an explanation will be given of an example of determining the complementary division conditions for some of the patterns for complementary division shown in FIGS. 6A to 6D by using the first analysis model and the second analysis model.

(Method of Determination of Rectangular Divided Width)

An explanation will be given of an example of determining the divided width of the LS patterns shown in FIG. 6C by stress-strain analysis using the second analysis model (step ST14).

Figure 11A:
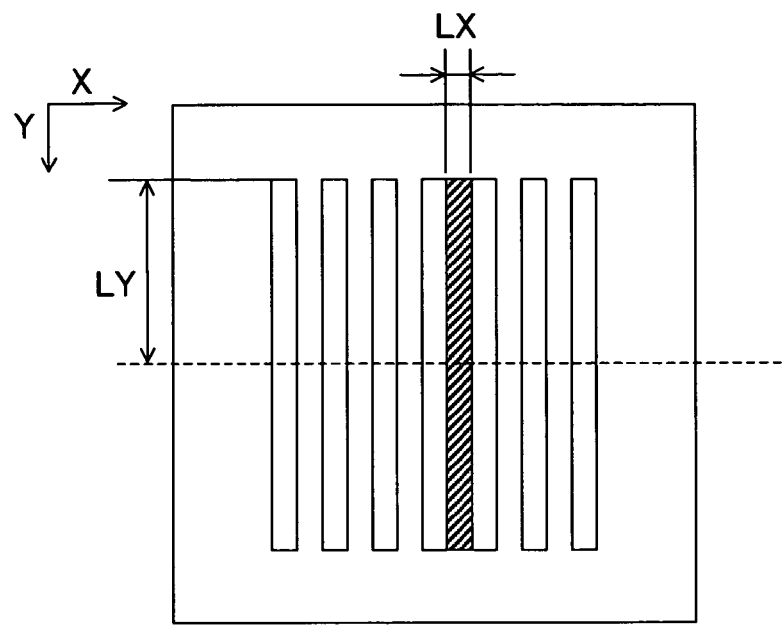
FIG. 11A is a view for explaining a second analysis model for determining the divided width of LS patterns.

Specifically, stress-strain analysis is carried out by, for example, the finite element method while changing the LX and LY (corresponding to the divided width in the present example) of the second analysis model envisioning the membrane indicated by hatching of the LS patterns shown in FIG. 11A. The analyzed result of displacement and the offset allowable by the stencil mask are compared to determine the optimum complementary division widths. For example, as found in the above, the result obtained by stress-strain analysis by setting the external force at 1.461 MPa is shown in FIG. 11B.

Note that the second analysis model in this case uses the membrane between lines arranged in parallel as in FIG. 11A as a model, so LY becomes a divided width for dividing the LS patterns.

Figure 11B:
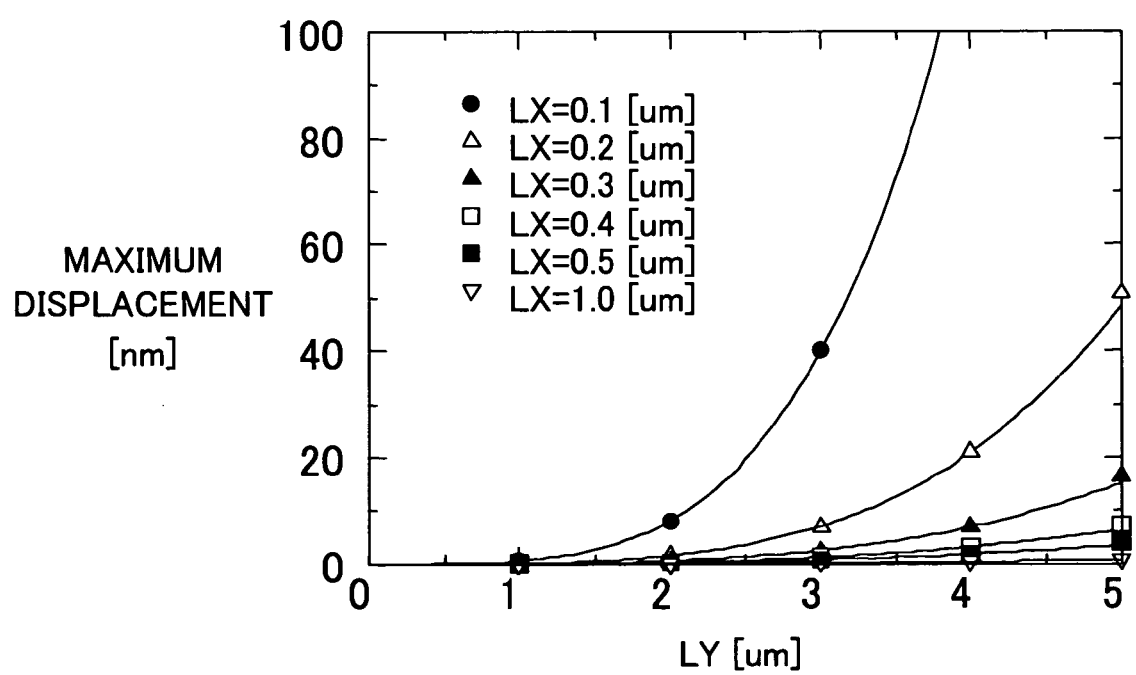
FIG. 11B is a view of the results of stress-strain analysis using the second analysis model.

FIG. 11B shows the stress-strain analysis results in cases of various membrane widths LX (LX=0.1, 0.2, 0.3, 0.4, 0.5, 1.0) where LY is plotted on the abscissa, and the maximum displacement is plotted on the ordinate. In LS patterns, contact of adjacent membranes across opening patterns due to external force is a phenomenon which must not occur since there is a possibility of destruction of the membrane. Accordingly, the allowable maximum displacement is ½ of the membrane width LX. The allowable maximum displacement is that for a case where the membrane width LX=0.1 $\mu$m is 50 nm. For this reason, it is seen from FIG. 11B that the maximum LY (corresponding to a divided width) when LX=0.1 $\mu$m is 3 $\mu$m. For example, a divided width of the LS patterns is made 3 $\mu$m or less.

As described above, the divided width in the LS patterns is determined by the second analysis processing.

(Method of Division of Large Area Pattern)

Next, the optimum conditions for dividing a large area pattern will be found. Before that, first, a "large area pattern" will be defined.

The point to be noted in division of a large area pattern (large shape) is that if the divided width is narrow, patterns having a high aspect ratio are formed and LS patterns end up being formed. Accordingly, a pattern where this problem would occur is defined as a "large shape". It is necessary to determine the divided width for such a large shape different from the divided width found in the above line pattern and LS patterns. Below, the conditions for determining a large shape by discriminating it from a rectangle such as a line will be shown.

$$\text{Pattern area/circumscribed rectangular area} \geq Ra \quad (1)$$

$$\text{Divided width/circumscribed rectangle short side} < Re \quad (2)$$

Note that in the above equations (1) and (2), Ra and Re are any values different for every stencil mask. Further, as the divided width (first divided width) of the above equation (2), use is made of the value of the divided width obtained by the determination of the divided width for the line pattern and the LS patterns described above.

Figure 12:
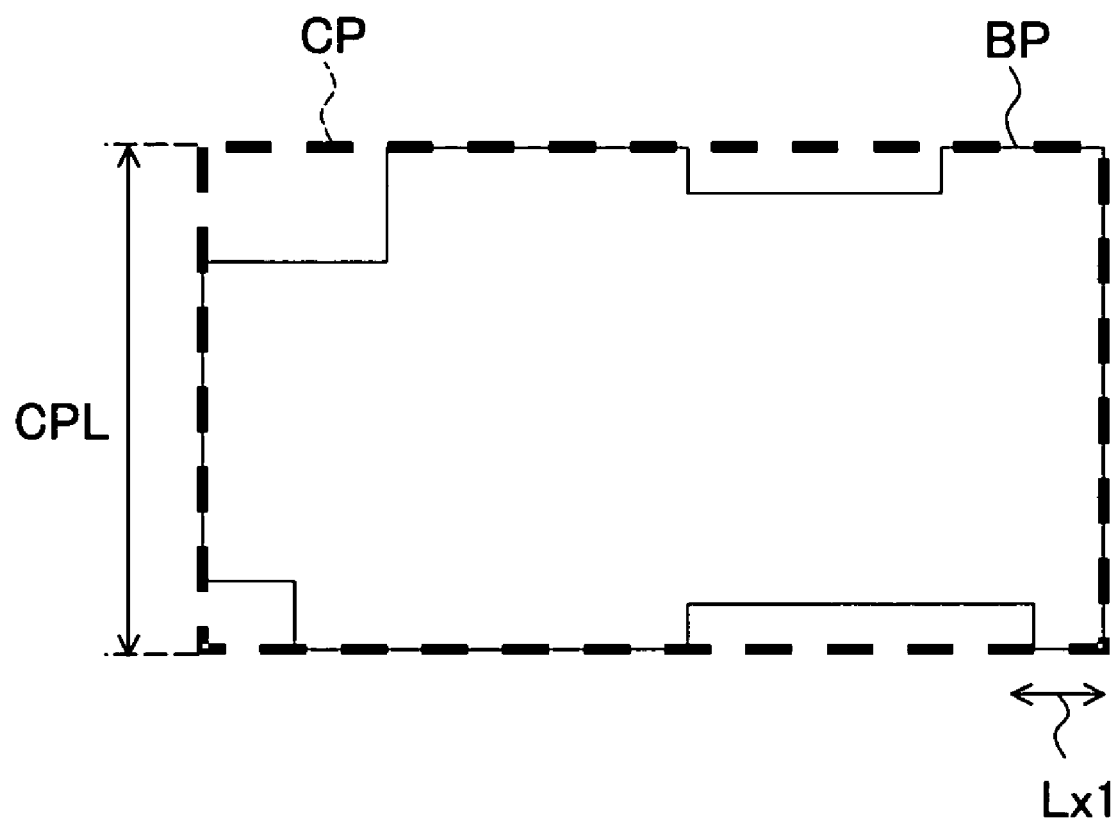
FIG. 12 is a diagram for explaining a large area pattern.

As shown in FIG. 12, when setting the circumscribed rectangle CP around the pattern BP, the left side of the above equation (1) is the area ratio between the circumscribed rectangle CP and the pattern BP. The large shape does not have any rough relationship with respect to the circumscribed rectangle, so Ra is a value near 1. For example, Ra=0.9 is set.

The above equation (2) is a conditional equation concerning the aspect ratio of patterns after division and is determined depending upon the stencil mask. Consider the case of dividing a large area pattern with the divided width LX1 along the long side direction as shown in FIG. 12 when designating the divided width of the line pattern and the LS patterns determined above as LX1. In this case, it is necessary to prevent the formation of LS patterns after the division. For this reason, for example, Re=0.5 is set.

Next, in order to determine the divided width of the large area pattern defined as described above, the first analysis processing by the first analysis model (step ST14) and the second analysis processing by the second analysis model (step ST15) are carried out. Namely, the first analysis model is used for analysis of the displacement and Mises stress in the case of changing the LX and LY of the split patterns comprised by the openings (refer to FIG. 9). Further, the second analysis model is used for analysis of the displacement of the membrane portion between the split patterns due to external force.

Figure 13A:
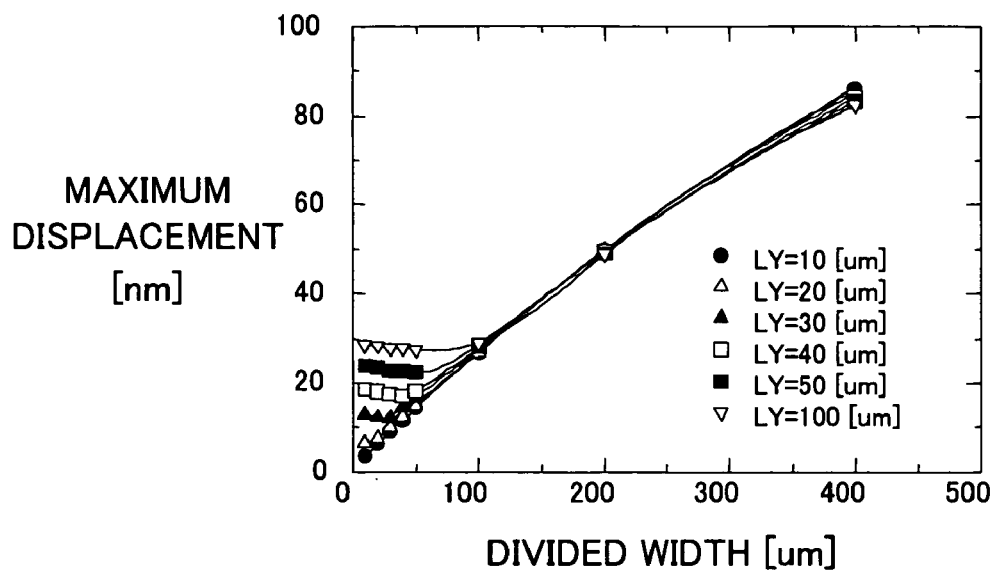
Figure 13B:
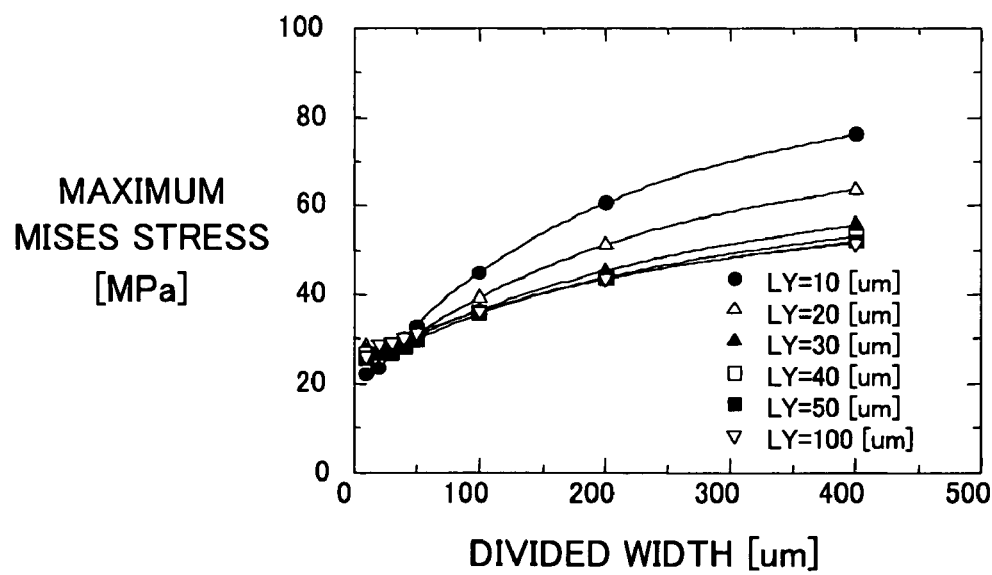

In the present example, the analysis was carried out using the first model for patterns obtained by dividing patterns having lengths LY (LY=10 μm, 20 μm, 30 μm, 40 μm, 50 μm, 100 μm) in the Y-direction and a length of 400 μm in the X-direction in a membrane 3 of 1 mm square surrounded by struts 4 (refer to FIG. 1) by the divided width LX (0 to 400 μm) along the X direction. FIG. 13A shows the analysis result of the pattern displacement; and FIG. 13B shows the analysis result of the Mises stress. For the stress-strain analysis by the finite element method at this time, use is made of the internal stress of 17 MPa of the stencil mask determined in the previous step.

Figure 14:
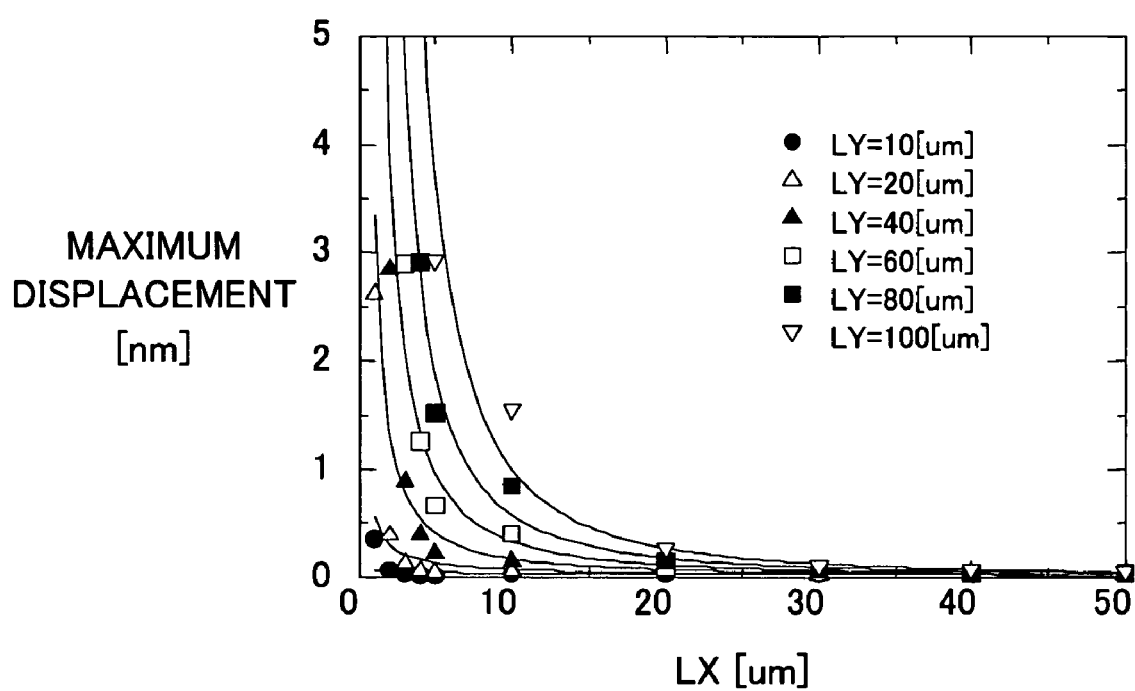
FIG. 14 is a view of the result obtained by analysis using the second analysis model for determining the division conditions of a large area pattern.

Further, FIG. 14 shows the result obtained by analyzing the displacement of the membrane due to external force by using the second model taking note of the membrane between the patterns divided under the same conditions as those of FIGS. 13A and 13B. For the stress-strain analysis by the finite element method at this time, use is made of the external force of 1.641 MPa determined in the previous step.

It is seen from the result shown in FIGS. 13A and 13B that the displacement becomes proportionally larger when the divided width LX exceeds the length of LY and that the Mises stress becomes larger when the divided width LX becomes larger. Further, it is seen from the result shown in FIG. 14 that the displacement is reduced as the membrane width LX (corresponding to the divided width) becomes larger when the LY is fixed.

From the above results, it is determined that for a large area pattern, when using the Re used for the definition of the large area pattern, a divided width satisfying the following equation is preferred.

$$Re \leq \text{large shape divided width/circumscribed rectangle short side} \leq 1 \quad (3)$$

As described above, by using the first analysis model and the second analysis model, the optimum divided width of a large area pattern can be determined. In the present example, a value which does not become larger than the allowable aspect ratio and does not exceed the circumscribed rectangle short side is preferred.

As explained above, in the complementary division condition determining method and program according to the present invention, the pattern displacement and stress concentration generated by the openings of split patterns are analyzed by the first analysis based on the internal stress value of the stencil mask determined based on experiments and simulation (numerical analysis). Further, the displacement of the membrane between the split patterns due to external force is analyzed by the second analysis. By these two analyses, the influence exerted by a pattern upon a stencil mask can be numerically grasped. Based on the above analysis results and the allowable values, the optimum complementary division conditions can be determined for various patterns for complementary division.

In this way, by performing stress-strain analysis from the two viewpoints of the openings of the patterns and the membrane between patterns, the optimum complementary division conditions for suppressing pattern displacement and mask destruction can be proposed. Further, by determining the internal stress value used for the stress-strain analysis based on experimental values and simulation, the reliability of the first analysis can be raised.

Accordingly, according to the complementary division method for complementary dividing patterns other than donut patterns, leaf patterns, and other hard-to-form patterns in a stencil mask using the complementary division conditions determined as described above, displacement of the pattern positions and mask destruction can be suppressed and a stencil mask having reliability can be provided.

The present invention is not limited to the explanation of the embodiment described above.

For example, in the above embodiment, the optimum division conditions were proposed for LS patterns and a large area pattern as examples, but the present invention is not limited to these. The optimum division conditions can also be calculated by analysis using two models in the same way for the contact patterns shown in FIG. 6A. The patterns for complementary division are not particularly limited.

Further, the internal stress value used for the analysis of the above embodiment was a value found for one stencil mask, but it is possible to find the same for stencil masks of various structures and materials. Of course, the Young's modulus and the Poisson ratio also differ according to the structure of the stencil mask. Therefore, physical values in accordance with the stencil mask used may also be used.

Further, in the second analysis, the external force calculated by using the equation used in *Appl. Phys. Lett.*, vol. 66, pp. 2655 (1995) was used for the stress-strain analysis, but this external force was obtained by considering wet washing. The calculation method and value of the external force differ in accordance with the process environment of the stencil mask.

Summarizing the effects of the invention, according to the complementary division condition determining method and program of the present invention, the optimum complementary division conditions for suppressing pattern displacement and mask destruction can be proposed for every pattern for complementary division.

According to the complementary division method for dividing a pattern by using the complementary division conditions described above, pattern displacement and mask destruction of the prepared stencil mask can be suppressed, and a stencil mask having reliability can be provided.

While the invention has been described with reference to specific embodiments chosen for purpose of illustration, it should be apparent that numerous modifications could be made thereto by those skilled in the art without departing from the basic concept and scope of the invention.

What is claimed is:

1. A complementary division condition determining method comprising:
    a step of measuring a displacement of a peripheral mark when forming an opening in a mask and determining an internal stress of said mask based on said measured displacement;
    a first analysis step of setting a first analysis model forming split patterns obtained by dividing a pattern for division under various division conditions at said mask having said internal stress and analyzing pattern displacement and stress concentration occurring due to the openings of said split patterns based on said first analysis model;
    a second analysis step of setting a second analysis model assuming a membrane between said split patterns as a two-ended fixed structure and analyzing the displacement of the membrane between said split patterns due to the external force based on said second analysis model; and
    a step of determining complementary division conditions based on the results of said first and second analysis steps and an allowable displacement and stress concentration.

2. A complementary division condition determining method as set forth in claim 1, wherein said step of determining internal stress of the mask comprises a step of finding in advance by analysis a relationship between internal stress in said mask and said displacement when forming said opening in said mask under the same conditions and determining said internal stress by comparing said measured displacement and the analysis results.

3. A complementary division condition determining method as set forth in claim 1, wherein said pattern for division includes a line pattern, line-and-space patterns, and large area pattern, and complementary division conditions are determined for each of these patterns for division.

4. A complementary division method for dividing a pattern defining an opening formed in a mask, comprising:
    a step of measuring a displacement of a peripheral mark when forming an opening in said mask and determining an internal stress of said mask based on the measured displacement;
    a first analysis step of setting a first analysis model forming split patterns obtained by dividing a pattern for division under various division conditions at said mask having said internal stress and analyzing pattern displacement and stress concentration occurring due to the openings of said split patterns based on said first analysis model;
    a second analysis step of setting a second analysis model assuming a membrane between said split patterns as a two-ended fixed structure and analyzing the displacement of the membrane between said split patterns due to the external force based on said second analysis model;
    a step of determining the complementary division conditions based on the results of said first and second analysis steps and an allowable displacement and stress concentration; and
    a step of extracting said pattern for division from the pattern data of said mask and dividing said pattern for division based on said determined complementary division conditions.

5. A complementary division method as set forth in claim 4, wherein said step of determining internal stress of the mask comprises a step of finding in advance by analysis a relationship between internal stress in said mask and said displacement when forming said opening in said mask under the same conditions and determining said internal stress by comparing said measured displacement and the analysis results.

6. A complementary division method as set forth in claim 4, wherein said pattern for division includes a line pattern, line-and-space patterns, and large area pattern, and complementary division conditions are determined for each of these patterns for division.

7. A complementary division method as set forth in claim 6, further comprising, when said pattern for division is a large area pattern,
    a step of setting a circumscribed rectangle around said large area pattern and
    a step of dividing the large area pattern into lines by a second divided width based on said determined complementary division conditions along the long side of said circumscribed rectangle.

8. A program for making a computer execute processing for determining division conditions for dividing pattern data, comprising:
    a routine for determining an internal stress of a mask based on a displacement of a peripheral mark when forming an opening in the mask;
    a first analysis routine for setting a first analysis model forming split patterns obtained by dividing a pattern for division under various division conditions at said mask having said internal stress and analyzing pattern displacement and stress concentration occurring due to the openings of said split patterns based on said first analysis model;
    a second analysis routine for setting a second analysis model assuming a membrane between said split patterns as a two-ended fixed structure and analyzing the displacement of the membrane between said split patterns due to the external force based on said second analysis model; and
    a routine for determining the complementary division conditions based on the results in said first and second analysis routines and an allowable displacement and stress concentration.

9. A program as set forth in claim 8, wherein said routine of determining internal stress of the mask comprises a routine of determining said internal stress by comparing an input displacement with a relationship between internal stress in said mask and said displacement when forming said opening in said mask under the same conditions.

10. A program as set forth in claim 8, wherein:
    said pattern for division includes a line pattern, line-and-space patterns, and large area pattern, and
    said first analysis routine and said second analysis routine are performed for each of the patterns for division to determine complementary conditions for each of the patterns for division.

* * * * *